US006574166B2

(12) United States Patent
Niemiec (10) Patent No.: US 6,574,166 B2
(45) Date of Patent: Jun. 3, 2003

(54) DRUG DELIVERY MANAGEMENT SYSTEM (75) Inventor: Mark A. Niemiec, Ponte Vedra, FL (US)

(73) Assignee: DDMS Holdings, L.L.C., Ponte Vedra, FL (US)

( * ) Notice: Subject to any disclaimer, the term of this patent is extended or adjusted under 35 U.S.C. 154(b) by 0 days.

(21) Appl. No.: 09/901,475

(22) Filed: Jul. 9, 2001

(65) Prior Publication Data

US 2002/0017996 A1 Feb. 14, 2002

Related U.S. Application Data (63) Continuation-in-part of application No. 09/611,582, filed on Jul. 7, 2000.

(51) Int. Cl.[7] .................. G04B 47/00; G04B 47/06; B65D 83/04; G08B 13/14
(52) U.S. Cl. .................. 368/10; 368/11; 206/531; 206/534.1; 340/568.1
(58) Field of Search .................. 368/10, 11, 204, 368/205; 340/568.1; 206/531–534; 221/2, 3, 15

(56) References Cited

U.S. PATENT DOCUMENTS

| 4,617,557 A | * | 10/1986 | Gordon | 340/568 |
| 4,749,875 A | * | 6/1988 | Hara | 307/150 |
| 5,412,372 A | * | 5/1995 | Parkhurst et al. | 340/568 |
| 5,852,590 A | * | 12/1998 | de la Huerga | 368/10 |

* cited by examiner

Primary Examiner—Vit Miska
(74) Attorney, Agent, or Firm—Reed Smith LLP (57) ABSTRACT A system for managing delivery of medication is formed of a blister package that includes a plurality of cells wherein each cell is sealed by a breakable wall and holds a unit-dose of medication. A user gains access to the medication by puncturing the breakable wall. A severable conductor is positioned proximate to each breakable wall and ruptures upon puncturing. A monitoring circuit senses the puncturing of each of the severable conductors. An RF transmitter sends information corresponding to usage of each medication stored in the blister package to a remote information transceiver. The package may also be provided with environmental monitoring sensors to allow analytical determinations of medication expiration. The package may furthermore be provided with a power supply which conforms to the back side of the package and an antenna formed by a printing a conductive element on the back side of the package.

41 Claims, 10 Drawing Sheets

DRUG DELIVERY MANAGEMENT SYSTEM

CROSS REFERENCE TO RELATED APPLICATIONS

The present application is a continuation-in-part (CIP) of U.S. patent application Ser. No. 09/611,582, filed on Jul. 7, 2000.

FIELD OF THE INVENTION

The present invention relates generally to systems and methods for tracking usage and preventing errors in the delivery of medical treatments. More particularly, the present invention relates to systems and methods for monitoring the delivery of medications to patients, such as over-the-counter and prescription drugs, as well as to systems and methods for insuring that such medications are administered to patients at prescribed times. Among other benefits, the present invention may save the lives of patients by reducing medical errors. The present invention also may reduce exposure of hospitals and other medical professionals to liability for errors arising from improper delivery of medications.

BACKGROUND OF THE INVENTION

The explosive developments in medical treatment relating to drugs have created a costly and high risk drug management environment for the patient. A 1995 study published in the "Archives of Internal Medicine" estimates that $76 billion is spent each year in the U.S. on extra doctor visits and hospitalization because people do not take their medication properly. In addition, a 1999 study by the National Academy of Science, Institute of Medicine, describes errors made in the hospitals which threaten patient's health. The study estimated that 98,000 patients die each year because of medical mistakes. Prescription drug errors are one of the major areas where mistakes are made.

Unit-dose blister type packaging for prescription drugs is one of the fastest growing package formats and is projected to be at 40% penetration in the U.S. market by 2003. Blister packages are already the dominant prescription drug package format in Europe with 85% penetration. Some of the reasons behind this growing use of blister packaging are: (i) product integrity being maintained throughout out the drug life cycle, (ii) better product protection to insure quality and efficacy of the drug, (iii) better tamper evidencing and child resistance, and (iv) improved patient compliance in that unit-dose blister packaging gives patents a clearly marked individual dosage.

The medication that can be contained in such packaging is diverse. Many of the medications, however, have chemical sensitivity to heat, humidity, light, or cold. Overexposure to these environmental conditions can reduce the potency of efficacy of the medication. As dosing (the amount of a medication prescribed) may be required to be within a specific range, the potency or efficacy of the medication must be accurately known to allow the correct amount to be taken by the patient. If the efficacy of a medication has been reduced, such as through over-exposure to sunlight, a prescribed dosage which assumes an efficacy associated with recently produced medication may be insufficient.

In order to avoid problems associated with environmental exposure and normal chemical breakdown over time, medication manufacturers have determined expiration dates at which it must be assumed that the medication has lost sufficient efficacy to prevent its use on a patient. The expiration date must rely on a worst-case estimate of when the medication loses efficacy, such that large amounts of medication are disposed of once the expiration date has been met. Organizations which must stockpile quantities of medication for use frequently must dispose of stock due to the expiration date, while the storage method used when stockpiling the medication has prevented the worst-case loss of efficacy.

In order to provide for the monitoring of medications, two controlling factors are the ability of a transceiver associated with a medication package to communicate with a master transceiver; and the ability of the package to have an energy source with a sufficient duration to provide for monitoring through the life of the medication contained in the packaging

SUMMARY OF THE INVENTION

The present invention is directed to a medication package and system for assisting in the management of the delivery of medications. The system includes a package that includes one or more unitary-dose cells. Each cell is sealed by a breakable closure. A user gains access to medication in a cell by rupturing the closure associated with the cell. A severable conductor is positioned proximate to each cell. The severable conductor associated with a given cell is cut upon rupture of the closure associated with the given cell, resulting in a loss of continuity through the conductor.

In a first embodiment, the medication package is provided with an attachable circuitry unit to create a medication management system. The unit includes a connector for attaching the medication package to circuitry contained in the unit. The circuitry in the unit allows the accessing of the cell or cells of the package to be monitored. Memory may be included in the unit to allow acquired data to be stored. A processor and clock may be included to allow recording of the time at which a cell or cells was accessed. Alternately, the processor may be used to determine when a cell should be accessed for medication to be taken. A signal such as a buzzer or light may be included to indicate an event to a user, such as when medication should or should not be taken. An RF transceiver may be included for communicating data from the unit and instructions or data to the unit.

In another embodiment, the system of the present invention is a blister package that includes a plurality of cells arranged in a grid. Each of the cells is sealed by a breakable closure and holds a unit-dose of a medication. A user gains access to the medication in a given cell by rupturing the breakable closure associated with the given cell. A severable conductor is positioned proximate to each breakable closure. The severable conductor associated with a given cell is cut when the breakable closure associated with the given cell is ruptured to allow access to the medication therein. A computer chip may be affixed to the blister package and electrically connected to the severable conductors. The computer chip senses the accessing of each cell in the package by monitoring for loss of continuity in individual conductors due to cutting of each of the severable conductors. An RF transmitter is affixed to the blister package and coupled to the computer chip. The RF transmitter may send information corresponding to usage of each of the medication stored in the blister package to a remote information transceiver.

In another embodiment, the RF transmitter sends information corresponding to usage of medication stored in one cell in the blister package to the remote information transceiver upon cutting of the severable conductor associated with the one cell.

In addition, the package may include a memory that stores time values, wherein each of the time values represents a time when medication stored in one cell in the blister package is due to be taken by a patient. Upon receipt of the information corresponding to usage of medication stored in one cell in the blister package, the memory stores a further time value representing a time when medication stored in one cell in the blister package was actually taken by the patient. In a particularly preferred embodiment, the remote information transceiver generates an alarm if the time when medication stored in one cell in the blister package is due to be taken by a patient passes before the remote information transceiver receives a signal indicating that medication stored in a cell in the blister package was actually accessed by the patient.

An RF receiver is also preferably affixed to the blister package and coupled to the computer chip. The RF receiver receives information corresponding to an expiration date of each of the medications stored in the blister package, and the computer chip stores such information. The expiration date information may, for example, be transmitted to and stored in the memory at the time of shipment of the blister package from a manufacturer or distributor. At a later time (e.g., at the time the blister pack is dispensed from a pharmacy), the RF transmitter may send the information corresponding to the expiration date to the remote information transceiver. In this embodiment, the remote information transceiver generates a further alarm if the time when medication stored in one cell in the blister package is due to be taken by a patient exceeds the expiration date information associated with the blister package.

In accordance with a further aspect, the remote information transceiver comprises a plurality of local RF sensors each of which is located is an individual hospital room, and a central computer coupled to each of the plurality of local RF sensors. The system also includes a plurality of portable data monitoring units each of which is coupled by a wireless link to the central computer. Each of the portable data monitoring units is associated with a medical professional who is responsible for administering medication to a group of one or more patients. In this embodiment, each alarm generated by the remote information transceiver is associated with a particular patient, and the remote information transceiver sends each such alarm to the portable data monitoring unit associated with the medical professional who is responsible for administering medication to the particular patient.

In accordance with a still further aspect, the package of the present invention further includes a temperature sensor coupled to the computer chip. The temperature sensor sends information corresponding to an ambient temperature proximate the package to the computer chip. An alarm is generated if the ambient temperature sensed by the temperature sensor exceeds a first threshold or is below a second threshold. The first and second thresholds correspond, for example, to the upper and lower temperature limits to which the pharmaceuticals in stored in the package may be exposed without losing efficacy. The alarm may be generated from information stored in the package memory (i.e., the allowable temperature limits), or alternatively, by the remote information transceiver based on similar information stored therein. As a result of the alarm, a patient or a medical professional responsible for administering medication to a patient will be immediately informed that the packaged medication should not be used if the package has been subjected to temperature conditions that are outside acceptable limits.

In accordance with a still further aspect, the package of the present invention includes a humidity sensor coupled to the computer chip. (The humidity and temperature sensor may be formed from an integrated unit on the package). The humidity sensor sends information corresponding to humidity proximate the medication cell to the computer chip. An alarm is generated if the ambient humidity sensed by the humidity sensor exceeds a first threshold or is below a second threshold. The first and second thresholds correspond, for example, to upper and lower humidity limits at which the exposure results in the loss of efficacy of medication stored in the package. The alarm may be generated from information stored in the package memory (i.e., the allowable humidity limits), or alternatively, by the remote information transceiver based on similar information stored therein. As a result of the alarm, a patient or a medical professional responsible for administering medication to a patient may be informed that the packaged medication should not be used if the package has been subjected to humidity conditions that are outside acceptable limits.

In accordance with a further embodiment, the package includes a light sensor, which is preferably coupled to the computer chip. The light sensor may monitor the amount of light to which medications within the blister pack are subjected. A warning may be generated if the cumulative amount of light to which the medication is exposed exceeds a threshold value such that the efficacy of the medication may be jeopardized. The warning may be generated based on information stored in the package memory, or, alternatively, by the remote information transceiver based on similar information stored therein. As a result of the alarm, a patient or a medical professional responsible for administering medication to a patient will be immediately informed that the packaged material should not be used if the package has been subjected to a cumulative amount of light that is outside of acceptable limits.

In accordance with a still further embodiment, the package may include an electronic circuit functioning to monitor and store data associated with environmental conditions including the humidity environment, the temperature environment, and the light environment. The monitored information of environmental conditions and severable conductor status may be transmitted to a drug dispensing and monitoring authority such as a Hospital or Pharmacy via an RF transceiver. The RF antenna, electronic monitoring function, and severable conductor monitors may be located on the patient medication package as surface mount type of devices. The electronic monitoring circuit may be implemented as one or more digital, analog, or mixed mode ASICs, FPGAs, or LSI and VLSI integrated circuits. The temperature, humidity, and light sensors may be connected to the electronic monitoring circuit such that they can measure environmental exposure to levels in excess of given limits over time.

The electronic components may be mounted on either one or both sides of the patient medication package. When electronic components are mounted on both sides of the medication container, through-hole interconnects or edge interconnects may be used to electrically interconnect the circuitry of one side to that of another.

In a still further embodiment, the medication package of the current invention may be provided with a power supply comprising a plurality of layers applied to one or both of the surfaces of the medication package. The power supply may comprise a flat battery applied to one side of the package, such as using a pressure sensitive adhesive, or may comprise a plurality of layers which comprise the cell being applied to the medication packaging using printing methods to apply electrodes and electrolyte mediums.

In a still further embodiment, the medication package of the present invention may further be provided with an antenna extending over a portion of the medication packaging to increase the ability of the medication package to receive and transmit RF communications from a remote transceiver. The antenna may be formed by applying a conductive material to one side of the medication packaging in areas separate from the cells used to contain medication. The application of the antenna to the surface may be accomplished prior to the forming of the medication cells, such as by using a hot thermoforming technique. Accordingly, the reverse side of the medication package may contain a power supply over a portion of the surface area of the side, while a further portion contains a printed antenna to improve communications efficiency.

These and other advantages and benefits of the present invention will become apparent from the detailed description and the claims below.

BRIEF DESCRIPTION OF THE FIGURES

The features, objects, and advantages of the present invention will become more apparent from the detailed description set forth below when taken in conjunction with the drawings.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical implementation of an interactive remote data information transfer system. Those of ordinary skill in the art will recognize that other elements are desirable and/or required in order to implement the present invention. However, because illustration of such does not facilitate a better understanding of the present invention, such elements are neither illustrated nor described herein.

Figure 1:
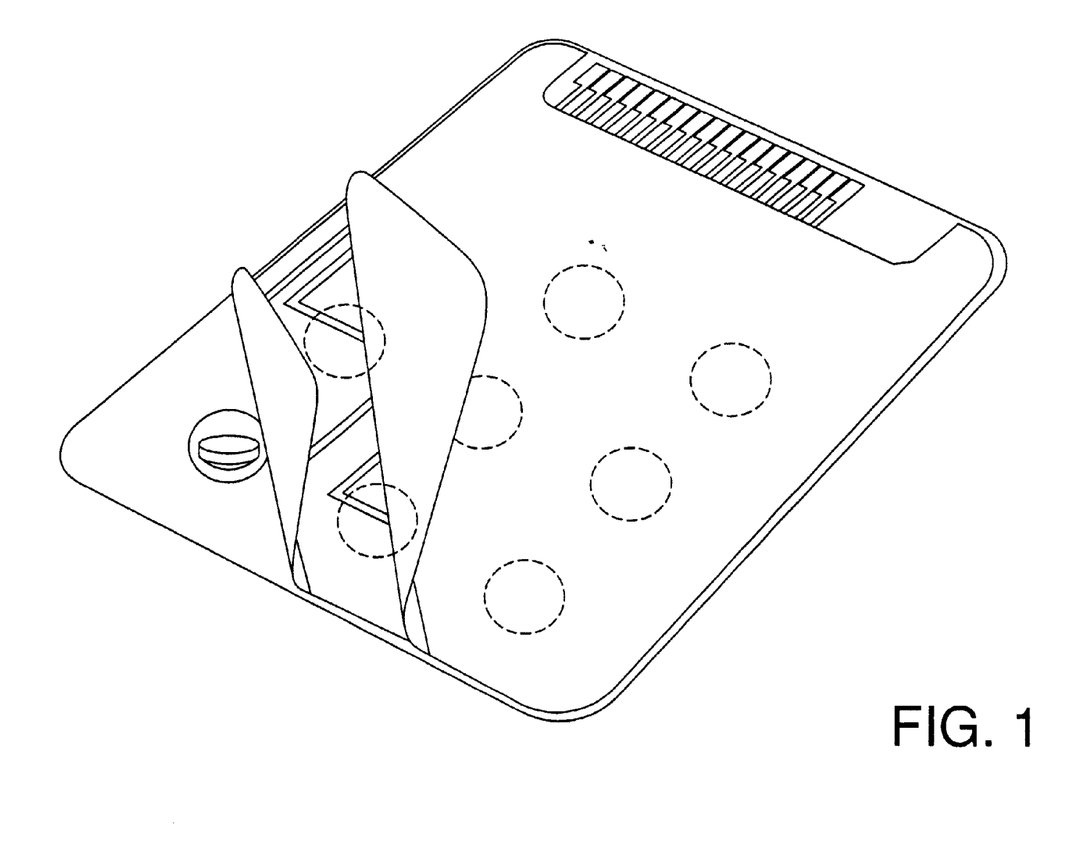
FIG. 1 shows a medication package with severable conductors, with the conductors disposed between a container and a breakable closure layer.

Referring now to FIG. 1, there is shown an illustration of a medication package 100 in accordance with the present invention. Medication package 100 includes a plurality of cells 110 arranged in a grid. Each of the cells 102 is sealed by a breakable closure 104 and holds a unit dose of a medication 106. A user (not shown) gains access to the medication 106 in a given cell 102 by rupturing the breakable closure 104 associated with the given cell 102. The medication package may include, but is not limited to, a single dose of a prescription drug, a single dose of an over-the-counter drug, or a combination of prescription and/or over-the-counter drugs.

A severable conductor 108 is positioned proximate to each cell 102. The severable conductor 108 associated with a given cell 102 is cut when the breakable closure 104 associated with the given cell 102 is ruptured to allow access to the medication 106. The cutting of the severable conductor 108 destroys the ability of the conductor 108 to conduct electricity.

The severable conductors 108 are preferably formed by printing a printed circuit 110 onto an insulating layer 112. The insulating layer 112 is preferably chemically inert to preclude interactions between the insulating layer 112 and medication 106 contained within a cell 102. The severable conductor 108 may be trapped between two insulating layers 112 where the material used for the breakable closure 104 is conductive, such as when a metal foil is used to form the breakable closure 104. The printed circuit 110 may contain traces which connect the severable conductors to edge pads 114, allowing an external device to be electrically connected to the severable conductors 108.

Figure 2:
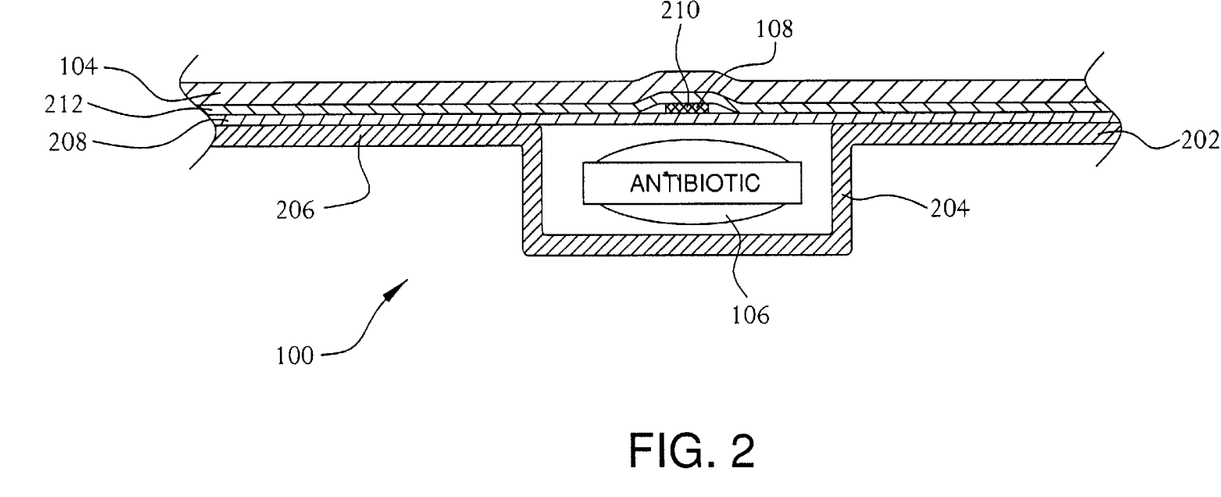
FIG. 2 shows a partial cross-section of a medication package according to the present invention, with a severable conductor formed in an intermediate layer disposed between a container and a breakable closure layer.

A cross-section of a medication package 100 according to the present invention is shown in FIG. 2. A blister card 202 is formed such that pockets 204 extend from a planar card 206. A thin layer of chemically inert dielectric material 208 is adhered to the planar card 206. Traces 210 forming the severable conductor 108 are then printed onto the dielectric layer 208. A second dielectric layer 212 may then be overlaid onto the first dielectric layer 208 and the traces 210. A breakable closure 104 may then be adhered to the second dielectric layer 212. Although the breakable closure 104 preferably extends over the entire top surface of the blister package to protect printed circuitry on the card, the breakable closure may be a plurality of individual closures each covering a cell. The breakable closure 104 is preferably a thin metal foil that tears easily upon application of force to a portion of the metal foil adjacent to a pocket in the blister card. Metal foils have the advantageous properties of being easily ruptured while still providing a barrier to moisture and light entering the cells before the breakable closures are ruptured. Non-conductive materials may also be used to form the breakable closure. If such non-conductive materials are used, the second dielectric layer may be unnecessary. It is assumed, for purposes of this application that manufacturers of blister-pack type packages fill the contents of each breakable closure or cell with a medication termed a unit dose or unitary dose. Physicians or other medical authorities can prescribe that patients consume the contents of two or more breakable closures at a dosage time for therapeutic reasons. This prescription-based nuance does not affect the principles of dispensing, packaging, or monitoring of the drug delivery system disclosed herein. Another alternative to blister pack packaging performed by some manufacturers is enclosing more than one individual medication item (tablet, pill, gelcap, capsule, etc.) in a blister pack cell. This manufacturing-based nuance also does not affect the principles of dispensing, a packaging or monitoring of the drug delivery system disclosed herein. In this application and in the claims, the term unit-dose or unitary dose relates to the medication contents of a single storage cell in a blister pack behind a breakable closure and is independent of a medication authority's prescription or suggested use or the number of medication items sealed in an individual blister pack cell. The breakage of the breakable closure 104 may dispense part, one, or more than one unit dose of medication to a patient depending on how the manufacturer of a blister pack packages the contents in the breakable closure cells.

Figure 3:
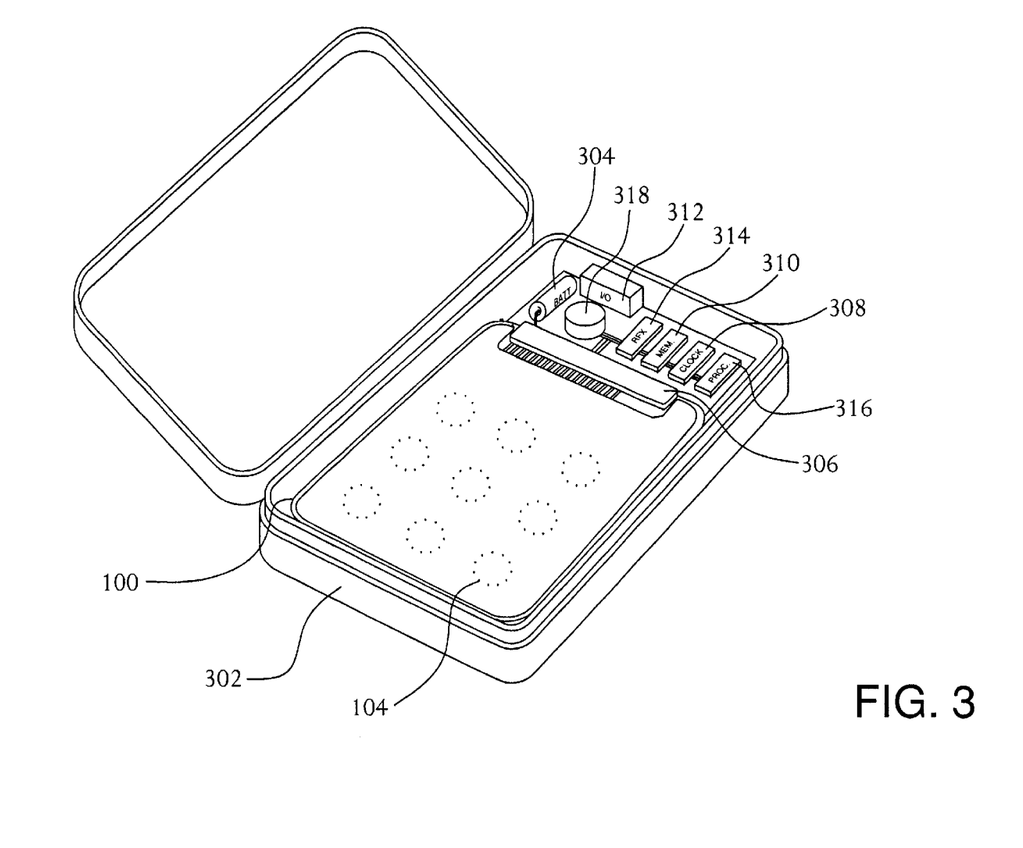
FIG. 3 shows a case for a medical package system including a plurality of severable connectors which are connected to the case, wherein the case further includes a power supply, a processor, a clock, memory for storing information, and an input/output device.

In a simple system utilizing a medication package according to the present invention, a data acquisition device in the form of a case 302 for a medication package as shown in FIG. 3 may be utilized. The case 302 includes a power supply 304, a connector 306 for connecting components within the case to the edge pads 114 of the medication package 100, a clock 308, and memory 310 for storing information regarding when severable conductors 110 associated with specific cells of a medication package 100 have been accessed. The case 302 may further include an input/output capability 312 allowing an external device to read the information stored in memory 310. Alternately, the case may include a RF transceiver 314 for transmitting the information to an external data logging device (not shown). The RF transceiver 314 may also be used to receive information for an alternate embodiment including a processor 316 and a signaling device 318, such as a buzzer or LED light. The signaling device 318 may be used to inform the user of the medication package when it is time to take medication, or when a scheduled time to take medication has passed without the medication being taken.

Figure 4:
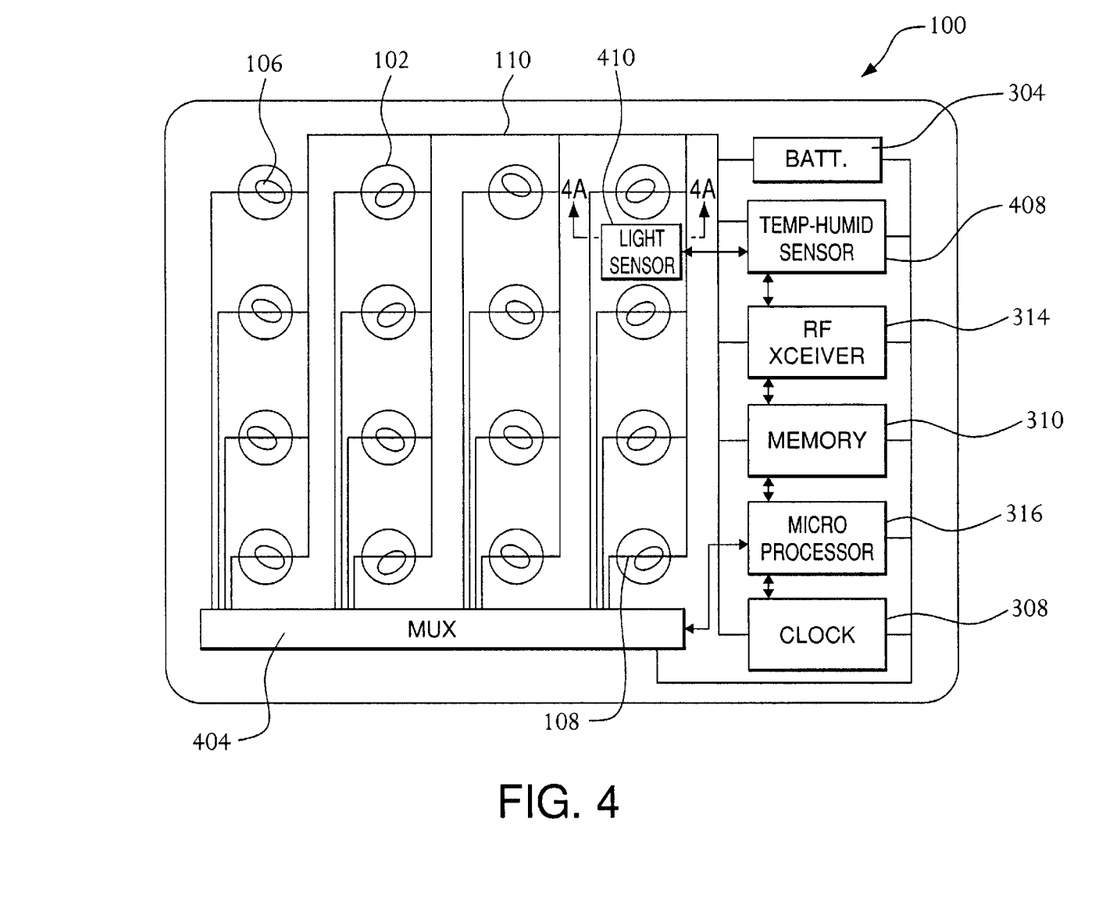
FIG. 4 shows a diagram of a medication package system including a plurality of severable conductors which are multiplexed, and further including a radio frequency transceiver for communicating acquired to an external data device.

In a further embodiment as shown in FIG. 4, a microprocessor 316 is affixed to the blister card 202 and electrically connected to the severable conductors 110. The microprocessor 316 senses the accessing of each cell 102 in the grid by monitoring the output of MUX 404 which, in turn monitors the cutting of each of the severable conductors 108. An RF transceiver 314 may be affixed to the medication package 100 and coupled to the microprocessor 316.

Figure 5:
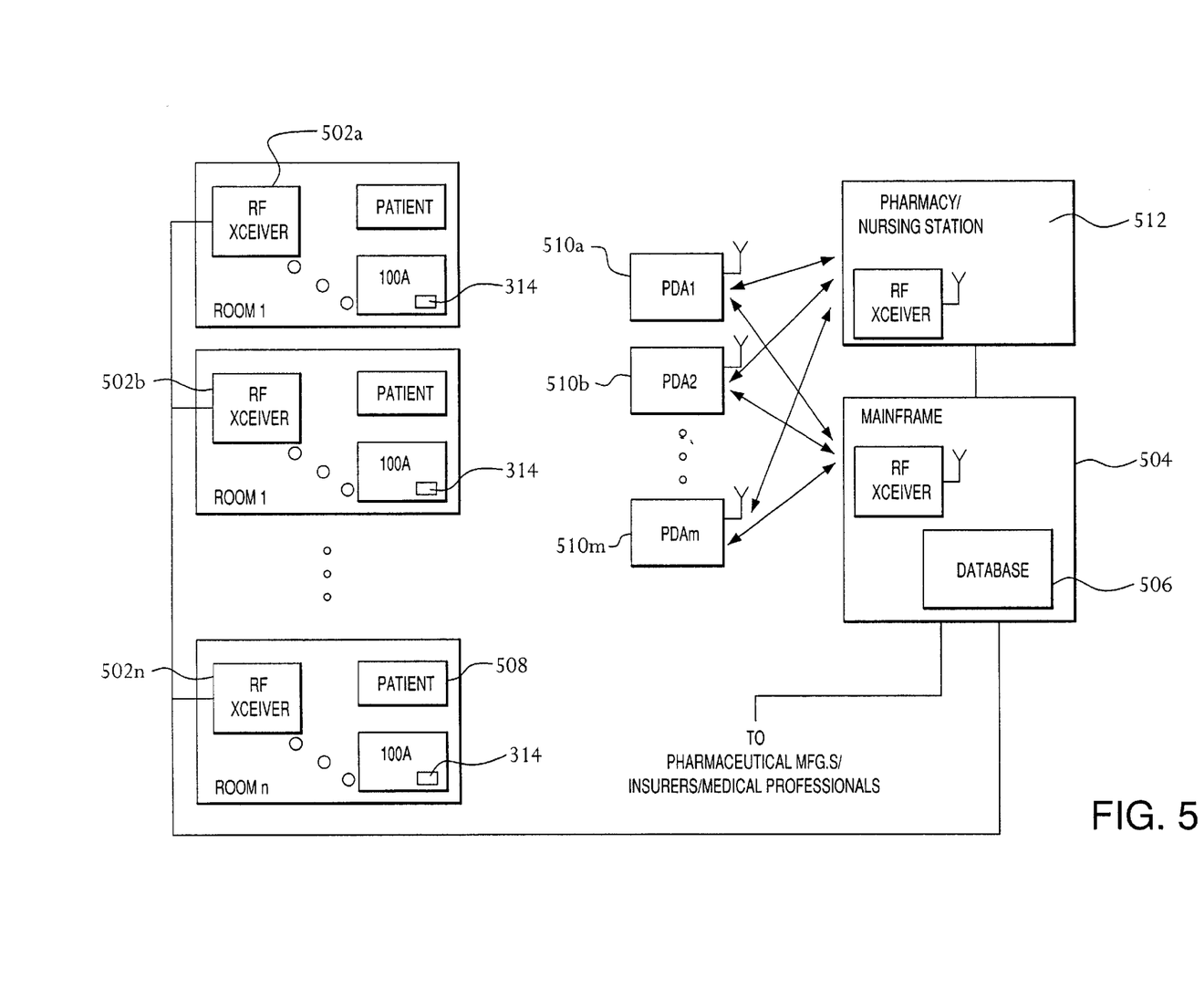
FIG. 5 is a block diagram showing the components of a drug delivery management system which may be used in a hospital environment, in accordance with a preferred embodiment of the present invention.
Figure 6:
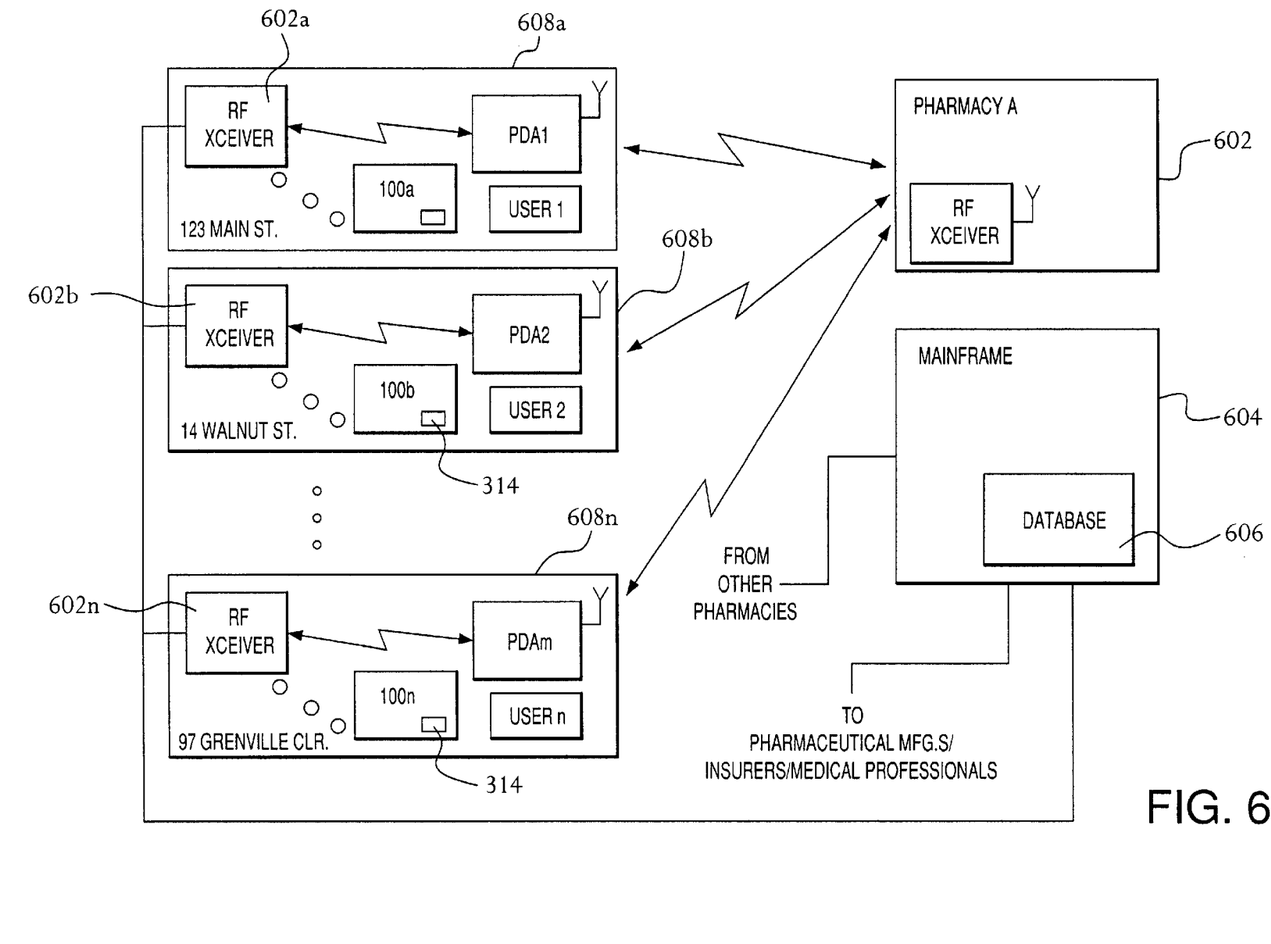
FIG. 6 is a block diagram showing the components of a drug delivery management system that may be used outside of a hospital environment, in accordance with a further preferred embodiment of the present invention.

The RF transceiver 314 may send information corresponding to usage of each of the medications stored in the medication package 100 to a remote information transceiver 502 (e.g., local RF sensors 502a, 502b, . . . and 502n, and central computer frame 504 in FIG. 5 or local RF sensors 602a, 602b, . . . , 602n in FIG. 6).

In an alternate embodiment, the RF transceiver 314 may send information corresponding to usage of medication 106 stored in one cell 102 in the medication package to the remote information transceiver 502 upon cutting of the severable conductor 110 associated with the one cell 102. In addition, the remote information transceiver 502 may be coupled to a database (shown as database 506 in FIGS. 5 and 6) that stores time values. Each of the time values stored in database 506 may represent a time when a medication 106 stored in one cell 102 in the medication package 100 is due to be taken by a patient (such as a patient 508 shown in FIG. 5). Upon receipt of the information corresponding to usage of a medication 106 stored in one cell 102 in the medication package, the remote information transceiver 502 stores a further time value in the database 506 representing a time when medication 106 stored in one cell 102 in the medication package was actually accessed by a patient 508. In a presently preferred embodiment, the remote information transceiver 502 generates an alarm if the time when medication 106 stored in one cell 102 in the blister package is due to be taken by a patient 508 passes before the remote information transceiver 502 receives a signal indicating that the medication 106 stored in the one cell 102 in the medication package was actually accessed by the patient 508.

In this embodiment, RF transceiver 314 also receives information corresponding to an expiration date of each of the medications 100 stored in the medication package 100, and the processor 316 stores such information in memory chip 310. The expiration date information may, for example, be transmitted to and stored in the processor 316 at the time of shipment of the medication package 100 from a manufacturer or distributor. At a later time (e.g., at the time the medication pack 100 is dispensed from a pharmacy), the RF transceiver 314 may send the information corresponding to the expiration date to the remote information transceiver 502. In this embodiment, the remote information transceiver 502 generates a further alarm if the time when medication 106 stored in a cell 102 of the medication package 100 is due to be taken by a patient 508 exceeds the expiration date information associated with the medication package 100.

In this embodiment, RF transceiver 314 also receives information corresponding to the acceptable temperature and humidity limits (e.g., the upper and lower temperature and humidity limits) to which the each of the medications 130 stored in the blister package 110 may be exposed without loss of efficacy, and the computer chip stores such information in memory chip 310. This acceptable temperature/humidity limit information may, for example, be transmitted to and stored in the memory 310 at the time of shipment of the medication package 100 from a manufacturer or distributor. At a later time (e.g., at the time the medication pack 100 is dispensed from a pharmacy), the RF transceiver 314 may send the information corresponding to the acceptable temperature/humidity limits to the remote information transceiver 502. As shown in FIG. 4, medication package 100 may further include a combined temperature/humidity sensor 408 coupled to the processor 316. The temperature/humidity sensor 408 sends information corresponding to the ambient temperature and humidity proximate package 100 to the processor 316.

An alarm is preferably generated in the system if the ambient temperature sensed by the temperature/humidity sensor 408 exceeds a first temperature threshold or is below a second temperature threshold. The first and second temperature thresholds correspond, for example, to the upper and lower temperature limits to which the pharmaceuticals in stored in the package may be exposed without losing efficacy. The alarm may be generated from information stored in memory 310 (i.e., the allowable temperature limits), or alternatively, by the remote information transceiver 502 based on similar information stored therein. As a result of the alarm, a patient or a medical professional responsible for administering medication to a patient will be immediately informed that the packaged medication should not be used if the package has been subjected to temperature conditions that are outside acceptable limits.

Similarly, an alarm is preferably generated in the system if the humidity sensed by the temperature/humidity sensor 408, corresponding to the humidity seen by medication in the package, exceeds a first humidity threshold or is below a second humidity threshold. The first and second humidity thresholds correspond, for example, to the upper and lower humidity limits to which the pharmaceuticals stored in the package may be exposed without losing efficacy. The alarm may be generated from information stored in memory 310 (i.e., the allowable humidity limits), or alternatively, by the remote information transceiver 502 based on similar information stored therein. As a result of the alarm, a patient or a medical professional responsible for administering medication to a patient may be immediately informed that the packaged medication should not be used when the medication has been subjected to humidity conditions that are outside acceptable limits.

Figure 4A:
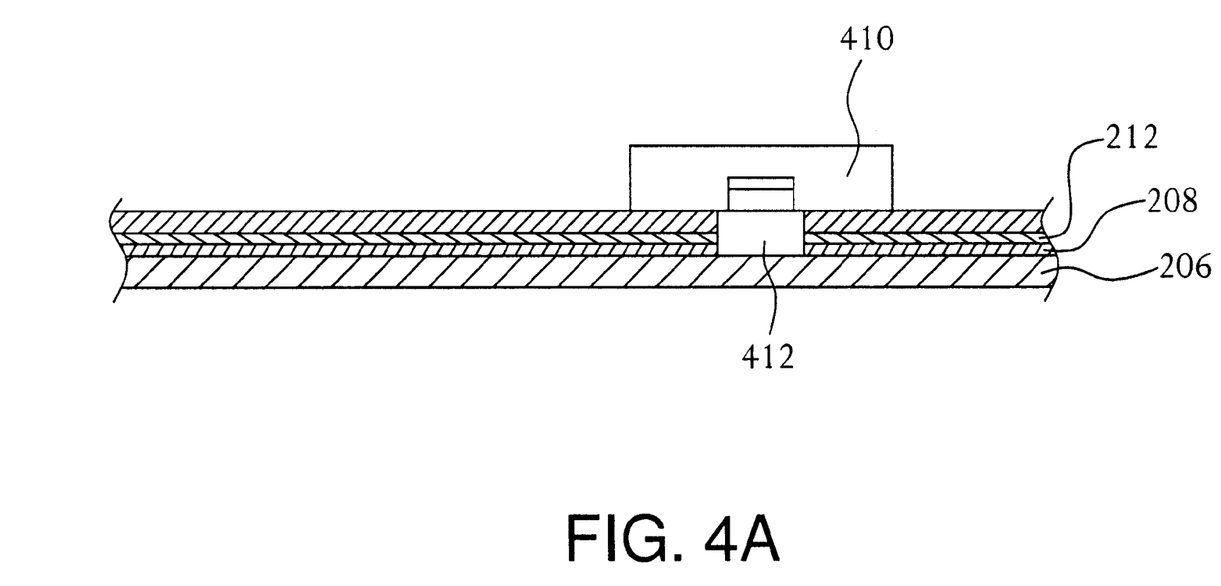
FIG. 4A shows a partial cross-section of a medication package according to the present invention, with a photoelectric sensor integrated with the medication package.

In addition to temperature and humidity sensing capabilities, light sensing capabilities may be advantageously included in the package. Light, and especially ultraviolet light, can cause degradation of the efficacy of medication. The shelf life of many medications is based on a worst-case exposure to such light, such that accurate monitoring of the exposure of the medication contained within the packaging may allow accurate estimation of the shelf-life of the medication contained in the blister package. As shown in FIG. 4A, a photo-electric sensor 400, filtered to measure only light which is adverse to the medication contained in the blister pack, is preferably mounted to the planar surface 206 of the blister card, with the photo-electric sensor exposed to light through the material from which the blister card is formed. If the photo-electric sensor is mounted to the breakable closure 104, an aperture 412 can be cut through the breakable closure 104 and any intervening insulating lays (208, 212). When so installed, the photoelectric sensor is exposed to light levels comparable to those levels to which medication in the in the blister pack is exposed.

By coupling the photo-electric sensor to a computer chip, the total exposure of the medication to light can be determined by summing the light levels over time to which the medication is exposed. A threshold level of how much light the medication can be exposed to without loss of efficacy can be provided to the computer chip, such that an alarm can be sounded when the exposure of the medication to light exceeds the threshold.

It is also important to monitor total exposure to all other environmental conditions. Exposure to adverse temperature and humidity levels can cause deterioration of the compounds comprising the medication, reducing the efficacy of the medication. Accordingly, the monitoring of such environmental conditions, such as temperature, humidity, and light, over time is greatly desirable to monitor the viability of the medication.

Referring now to FIG. 5, there is shown a block diagram of the components of a drug delivery management system 500, in accordance with a presently preferred embodiment. In this embodiment, the remote information transceiver 502 comprises a plurality of local RF sensors 502a, 502b . . . 502n, each of which is located is an individual hospital room, and a central computer 504 coupled to each of the plurality of local RF sensors. The system also includes a plurality of portable data monitoring units 510a, 510b, . . . 510m, each of which is coupled by a wireless link to the central computer 504 and a pharmacy/nursing station 512. Each of the portable data monitoring units 510a, 510b, . . . 510m is preferably a personal data assistant (PDA), such as a Palm Pilot™ computer, having an integrated wireless modem, and is associated with a medical professional who is responsible for administering medications 106 contained in medication packages 100a, 100b, . . . 100n to a group of one or more patients 508. In this embodiment, each alarm generated by the remote information transceiver 502 is associated with a particular patient 508, and the remote information transceiver sends each such alarm to the portable data monitoring unit 510a, 510b, . . . 510m associated with the medical professional who is responsible for administering medications to the particular patient 508. In addition to receiving such alarms, the portable data monitoring units 510a, 510b, . . . 510m may be used by the medical professionals to send prescription requests directly to the hospital pharmacy 512 via a wireless link, thereby minimizing paperwork and allowing central computer 504 to track the delivery process for a particular patient from the time the prescription is written to the time the medication is actually taken by the patient.

In addition to generating alarms in cases where a specific medication has not been timely delivered, the system of the present invention can monitor all medications being taken by a given patient (at, for example, central computer 504), and generate an alarm if a proposed combination due to be administered to a given patient poses a risk of an unacceptable drug interaction. Furthermore, the medication usage information tracked by the present invention may be transmitted electronically (via central computer 504) to pharmaceutical manufacturers/health maintenance organizations, so that such entities may monitor in real time the usage of drugs by patients.

FIG. 6 is similar to FIG. 5, but shows an implementation of the present invention outside of the hospital environment. RF transceiver 602, 602a, . . . 602n can be located in a patient's home 608a, 608b, . . . 608n or is a pharmacy 610 to allow information to be exchanged with the medication package 100. A mainframe 604 can be used to accumulate data for pharmaceutical manufacturers, health insurance, medical professionals, and other interested parties regarding the usage of medication.

Figure 7:
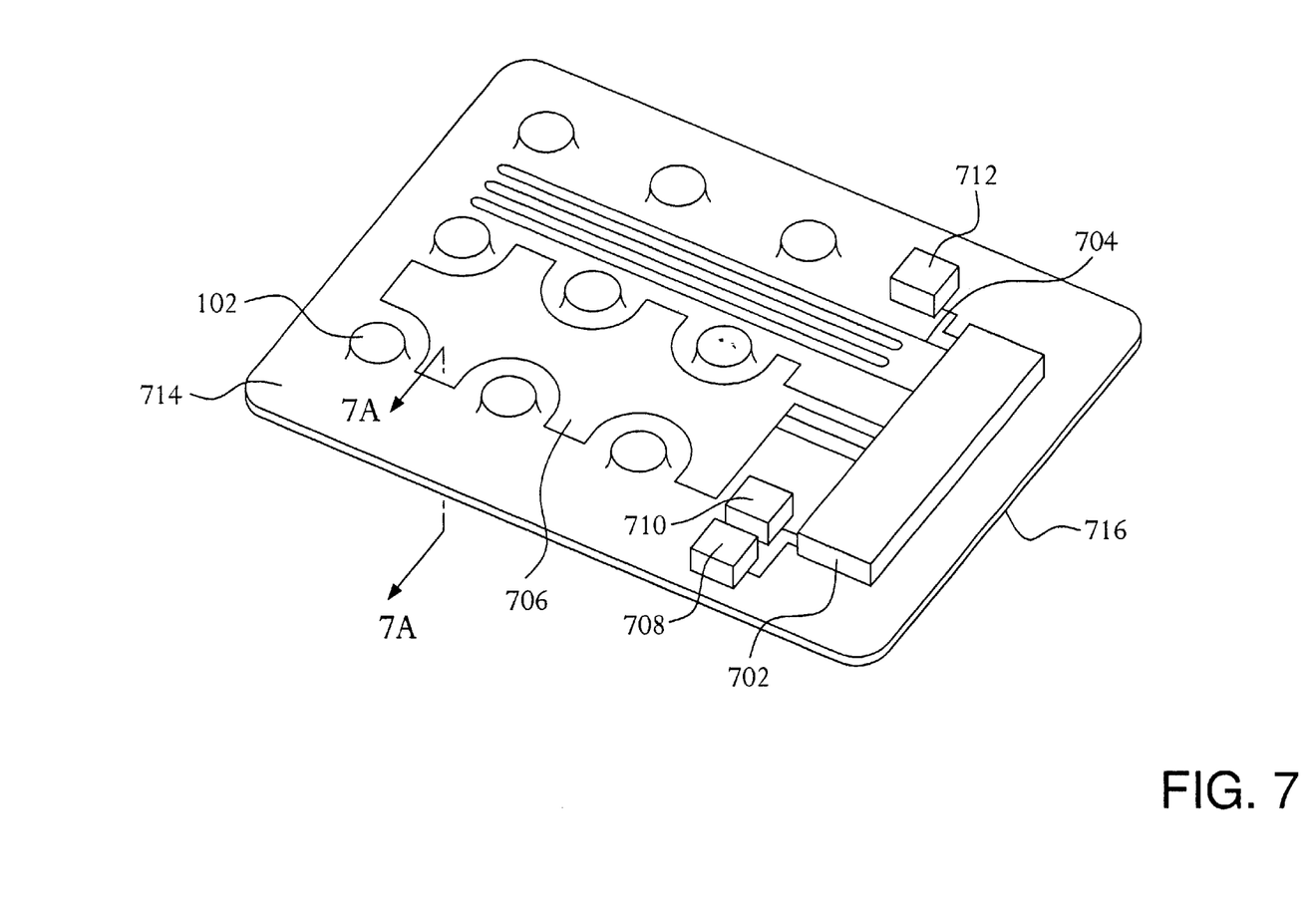
FIG. 7 is an illustration of a medication package according to the present invention embodying components applied to the closed side of the medication package, incorporating pass through connections between the components and the severable connections bridging the cells on the open side of the medication package.

As shown in FIG. 7, a more compact form may be implemented by using surface mounted electrical and electronic components or commonly known film deposited or etched component equivalents. Application of standard or customized surface mount semiconductor devices or discrete components directly on the "blister pack" surfaces of the patient medication package may result in a lighter weight, more compact and hence more convenient package.

One consideration which drives a high integration implementation of the medication package is the RF environment. RF compatibility with existing devices operating at close proximity with similar frequencies drives both the medication package RF antenna, modulation scheme, and unit power designs. Implementation of the medication package with an RF interface similar to that of an standard Radio Frequency Identification Device (hereinafter "RFID") is desirable. Yet, most RFIDs do not accommodate the volume of data that is expected of the instant invention. However, an RFID methodology may be used to efficiently implement the transceiver function. Additionally, the overall system requirements may involve transmission values of Effective Radiated Isotropic Power, (hereinafter "EIRP"), of up to 0.5 Watt, in order to accommodate a reasonable transmission power margin for distances of up to 10 meters allowing response to a remote polling information RF transceiver. Depending on the country where used, the allowable frequency transmission bands may vary to accommodate local electromagnetic spectrum restrictions. To accommodate different design options for different locations and RF operating environments, flexibility in medication package RF antenna configuration is desirable. The medication package can also be capable of operating in a narrow bandpass so as not to transmit outside of the prescribed pass-band for the system location. This is well within the capability of integrated circuits within the practiced art. However, it still may be beneficial to build medication packages tailored for use in a particular location due to spectrum use limitations. As a specific example, a 915 MHz model may be built for the US market and a 869 MHz model may be built for Europe. These frequencies bands in these locations are typically used for RFID applications and the instant application may also perform well around these exemplary frequencies. These differences may be accommodated by selecting electrical component designs tuned to the respective operating conditions.

FIG. 7 illustrates one possible embodiment of a physically compact patient medication package, which utilizes the space and volume associated with the closed cell side of the medication package. The closed cell side is the side from which the individual medication cells 102 extend. The system shown in FIG. 7 includes a control unit 702, an antenna 704, a power supply 706, and light 708, temperature 710 and humidity 712 sensors. Each of these components are located on the closed cell side 714 of the medication package 100. The cells 102 protruding from the surface of the closed cell side 714 of the medication package 100 may provide protection for components located in the valleys between the cells 102.

The control unit 702 may integrate the functions of a multiplexer, processor, memory, clock or timer, and RF transceiver. The control unit 702 may be implemented as a combination of a hybrid analog and digital IC, mixed mode standard or custom digital or analog ASIC, FPGA, LSI or VLSI device. Additionally, the control unit 702 may include an RFID. As such, the "single" control unit 702 shown in FIG. 7 may in fact be a number of interconnected semiconductor devices.

The light sensor 708 is preferably placed such that the sensor 708 monitors the light transmitted through the material from which the medication package 100 is formed. The light sensor 708 may thus be able to incorporate effects associated with filtering properties of the medication package material into the measurement of the light which medication 106 in the individual cells 102 is being exposed. An area (not shown) of the open cell side 716 corresponding to the location of the light sensor 708 is preferably left without any coating, cover, or layer, such as the severable membrane, to allow light to pass through the material without additional effects from any coatings or layers. Alternately, the light sensor 708 may be placed on the open cell side of the medication package 100, measuring the light through the material of the medication package 100 from a direction consistent with the direction from which medication in the cells would be exposed to the light. Such an implementation could be accomplished by forming the light sensor 708 from a photo-resistive or electrically photo-reactive material applied as one of the layers on the open cell side 716 of the medication package 100.

The humidity sensor 712 presents special problems in measuring a value which is relevant to the humidity to which medication 106 contained in the cells 102 is being exposed. The humidity sensor 712 must measure moisture transmission through either the closure layers 718 (not visible since located on reverse side of medication package 100 in illustration) on the open-cell side 716, or through the material of the medication package 100 on the closed cell side 714. Additionally, moisture may be communicated to the cells 102 through the boundary between the closure layers 718 and the material of the medication package 102. Thus, it is presently preferred to provide a portion of the medication package with a hole which forms a cavity when closed from the open cell side 716 by the closure layers 718, and closed from the closed-cell side 714 by the body of the humidity sensor itself. Such a configuration allows meaningful data to be acquired, without having to resort to placing the humidity sensor 712 in a dedicated cell.

The temperature sensor 710 has minimal concerns with regards to its orientation or placement on the medication package 100, since the temperature of the medication package 100 and the medications 106 contained therein normalize to the ambient temperature. Thus, simple placement of the temperature sensor 710 on the closed-cell side 714 of the medication package 100 allows meaningful temperature data to be obtained.

Operationally, the temperature sensor 710 may be a thermistor, thermocouple or other temperature sensitive device. The measured values form the sensor 710 may be compared to predetermined maximum and minimum thresholds of temperature exposure for the given medication 106. When exposure levels exceed the threshold values, a cumulative indication of the exposure may be stored. The memory storage location may be either in separate memory, or it may be a simple storage register in the processor. In either event, a value associated with a minimum threshold may be maintained as well as a value associated with a maximum temperature threshold. A third value may be stored to indicate humidity measurements in excess of a humidity threshold, and a fourth value may be stored to indicate light measurements in excess of a light exposure threshold. Exposures exceeding either the upper or lower environmental thresholds for a given medication may be cumulatively recorded in a storage location. This may be accommodated in a standard processor register or memory location by simply incrementing an appropriate register or storage location with each cumulative unit of exposure to excess levels. In this way, an elapsed time indication of exposure levels may be obtained. Any level in excess of the threshold values may be ascertained by comparing the measured value against the threshold values via numerical compare or other simple threshold detectors. The above-mentioned monitoring functions may be performed by either hardware, (example; within the processor or equivalent FPGA or or via software running from either memory or as part of the processor built-in program storage.

As shown in FIG. 7, the power supply 706 for the medication package 100 may be formed in a shape which conforms to the surface of the closed-cell side 714 of the medication package 100. The protrusion of the cells 102 from the closed-cell side 714 of the medication package 100 limits the ability to locate components of the surfaces of individual cells 102. By conforming the power supply 706 component around the protrusions which form the cells 102, the power supply 706 may utilize a significant portion of the flat surface of the closed-cell side 714, while still retaining the protection from the protrusions which form the cells 102. The ability of the power supply 706 to occupy a larger surface area allows the power supply 706 to be larger without exceeding the physical envelope of the medication package 100.

Figure 7A:
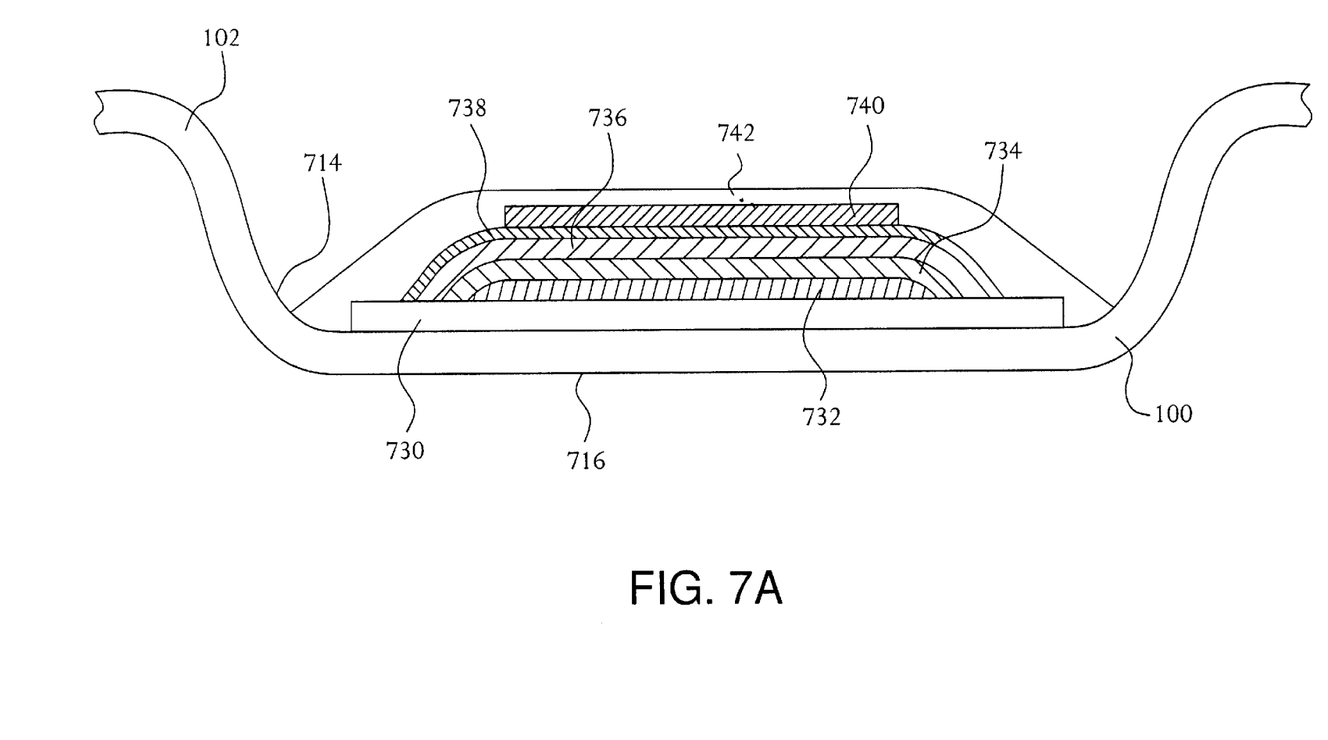

The power supply 706 may comprise a plurality of metallic and electrolytic layers to form a battery, as shown in FIG. 7A, which is a cross-section of the medication package 100 of FIG. 7 along line A—A. The individual layers may be applied to the medication package prior to the cells being formed in the medication package, i.e., when the medication package is still flat stock. Successive layers of printing may be used to form: an insulative layer 730, a conductive layer 732 for transmitting electrical current to other components on the medication package 100, a metallic layer 734 which forms an anode for the power supply 706, a layer of electrolytic material 736, a metallic layer 738 which forms the cathode for the battery, and a second conductive layer 740 for transmitting electrical current to other components. Additionally, multiple layers may be used to form a multi-cell battery, while a protective coating 742 may be additionally printed over the battery layers to form a protective coating. Once the layers which form the battery and the other components have been formed, the medication package 100 may be formed from the card stock by heating and vacuum extruding the cells from the card stock. Holes which are required for passing connections through the card stock, or for exposing sensors (as described above with regards to the light and humidity sensors) may preferably be formed before the printing of any layers onto the medication package 100. Alternately, the layers which comprise the components may be formed as a separate label, and then bonded to the medication package 100 before or after the cells 102 have been formed.

The surface of the closed-cell side 714 of the medication package 100 may also be advantageously used to allow the size of an antenna 704 associated with the RF transceiver to be maximized. As shown in FIG. 7, a loop antenna 704 may be formed on the closed-cell side surface 714 of the medication package 100 by applying a conductive layer to the surface using standard printing techniques. Such an antenna 704 may also be formed in conjunction with the other components which are to be located on the medication package 100.

In the component configuration shown in FIG. 7, the severable conductors 108 are located on the open-cell side 716 of the medication package 100, while the remaining components are mounted on the closed-cell side 704 of the package 716. Accordingly, a method for providing a communicable connection between the severable conductors 108 and the control unit 702 must be provided. A pass-through hole or set of pass through holes may be provided through the material of the medication package 100 to allow conductive material to connect the traces which comprise the severable connectors 108 on one side of the medication package 100 to be in communication with traces which lead to the control unit on the opposite side of the medication package 100.

Alternately, where components are mounted onto a closure layer on the open-cell side 716 of the medication package 100, tearing of the closure layer which could potentially disturb the components may be prevented through the use of score lines adjacent to the components, such that tearing or ripping of the barrier layer would tend to follow the score line, as opposed to continuing through the material underlying a component.

Figure 8:
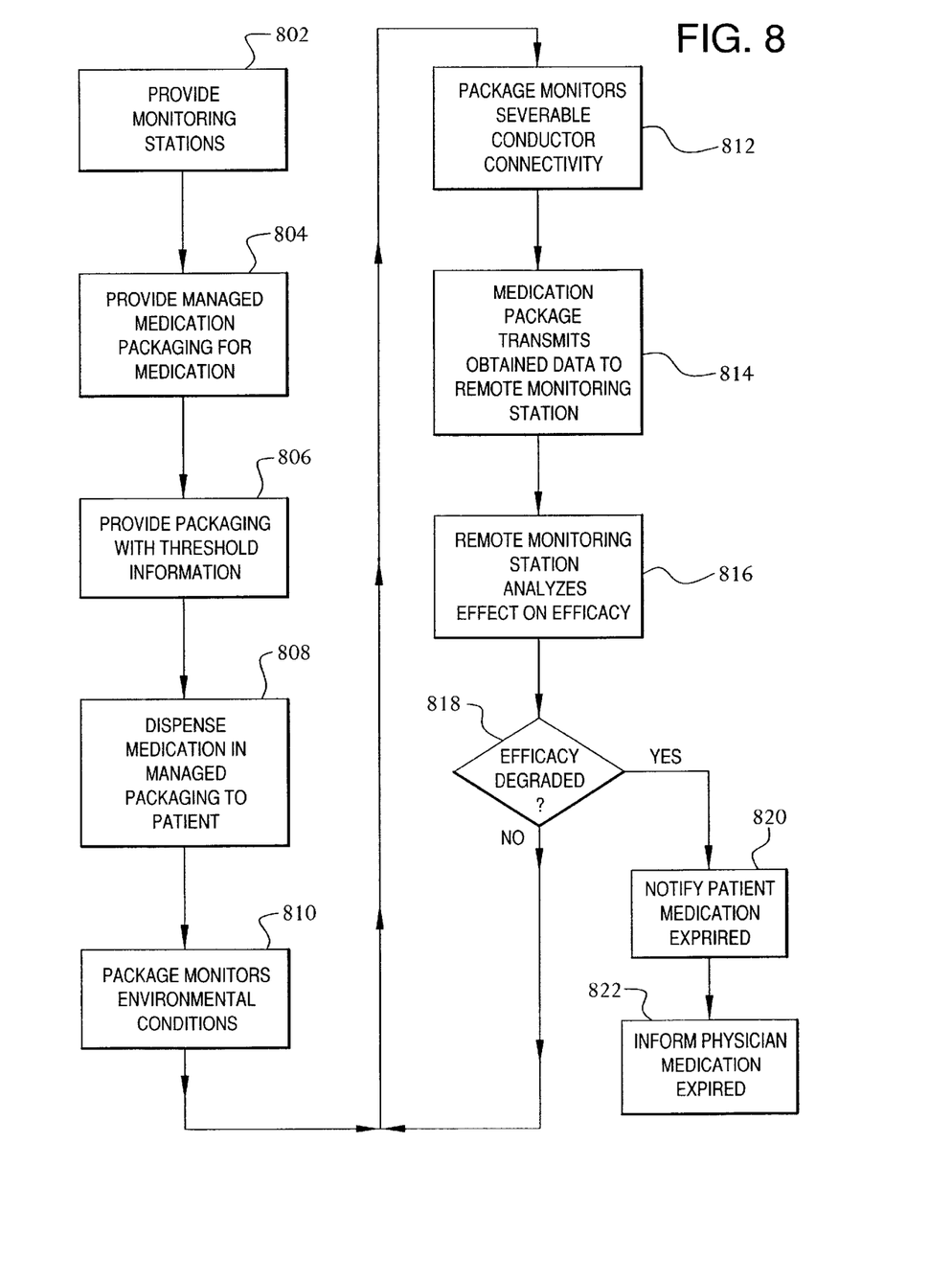

As shown in FIG. 8, the present invention may also be embodied in a process for monitoring packaged medication. The ability of the medication package to monitor cumulative environmental characteristics allows the continued efficacy of the medication to be tested. Accordingly, the patient, the patient's physician, or patient's pharmacy can be notified that the medication is no longer within an acceptable efficacy range, and thus should be replaced. The method of monitoring packaged medication comprises providing 802 monitoring stations that can receive data from the medication packaging relating to the data monitored by the medication packaging. Also, managed medication packaging, such as described above, is provided 804 for medication to be dispensed. The managed medication packaging should then be provided 806 with threshold environmental information in order to allow the medication packaging to monitor for out-of-tolerance exposures. The medication in the managed medication packaging may then be dispensed 808 to a patient for whom the medication is described. The managed medication packaging may then monitor 810 the environment and the severable connectors 812 to which the medication package is exposed. This information may then be transmitted 814 to a remote monitoring station such that the effects of the cumulative environmental exposure may be analyzed 816 to estimate the effect on medication contained within the packaging. Alternately, a basic algorithm may be included in the control unit of the medication packaging such that the information transmitted from the medication packaging to the monitoring station may comprise a signal that the medication has been exposed to environmental characteristics that exceed the allowable exposure limits for the medication. As the medication packaging is intended to be disposable, it s presently preferred to keep the medication packaging control unit as simple as possible. Thus, the present unit uses simple counters that increment as exposures exceeding thresholds are monitored.

The transmission of data from the medication packaging to the monitoring stations is preferably accomplished using some form of a polling function to allow the life of the power supply associated with the medication packaging to be maximized. Accordingly, the packaging may be provided with instructions such that it transmits data only upon receipt of a query from a monitoring station. Additionally, the control unit may be provided with instructions such that a time period must elapse before the package will again transmit its accumulated data, such that the high energy usage associated with transmission will not be redundantly invoked by sustained proximity to a monitoring station.

Once it has been determined 818 that the efficacy of the medication has been degraded, the patient who is taking the medication may be notified 820, such as by an automated phone call, that the medication has expired, and that new medication should be procured. The process may also involve notifying 822 a physician of the expiration of the medication, such that the physician can both ensure that the expired medication is disposed of, as well as to inform the physician of the need to prepare a new prescription for the patient.

The previous description of the preferred embodiments is provided to enable any person skilled in the art to make and use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A package for medication, the package comprising:
   (a) a medication container containing a plurality of storage cells;
   (b) an electronic monitoring circuit affixed to said medication container;
   (c) at least one breakable closure associated with a storage cell, said at least one breakable closure further comprising a severable conductor proximate to said storage cell, said at least one breakable closure securing a unit dose of medication, said severable conductor being communicably connected to said electronic monitoring circuit;

(d) at least one environment sensor affixed to said medication container, said at least one environment sensor being communicably connected to said electronic monitoring circuit;

(e) an RF transceiver affixed to said medication container, said RF transceiver being communicably connected to said at least one monitoring circuit;

(f) an RF antenna affixed to said medication container, said RF sensor being communicably connected to said RF transceiver; and (g) a power supply;

wherein least one severable conductor is severed upon breaking of the breakable closure, said severance being detected by said monitoring circuit, wherein data associated with said at least one environment sensor is acquired by said electronic monitoring circuit, wherein said RF transceiver transmits said data associated with said severance and said data associated with said at least one environment sensor, and wherein said data is radiated from said RF antenna.

2. A package for medication according to claim 1 wherein said at least one environment sensor comprises a temperature sensor.

3. A package for medication according to claim 2, wherein said temperature sensor is a thermistor.

4. A package for medication according to claim 2, wherein said temperature sensor is a thermocouple.

5. A package for medication according to claim 1, wherein said at least one environment sensor comprises a humidity sensor.

6. A package for medication according to claim 1, wherein said at least one environment sensor comprises a light sensor.

7. The package for medication according to claim 1 wherein said RF transceiver is integrated with said electronic monitoring circuit.

8. A package for medication according to claim 1 wherein said RF transceiver comprises at least one radio frequency identification device.

9. A package for medication according to claim 8, wherein said RF transceiver transmits in response to an RF signal received by said RF transceiver.

10. A package for medication according to claim 1, wherein the data transmitted by said transceiver comprises a medication package identifier, a status of said severable conductors, and data associated with said at least one environmental sensor.

11. The package for medication according to claim 1 wherein said RF antenna comprises a printed circuit trace.

12. A package for medication, the package comprising:

(a) a medication container containing a plurality of storage cells;

(b) at least one monitoring circuit affixed to said medication container;

(c) at least one breakable closure associated with a storage cell, said breakable closure further comprising a severable conductor proximate to said storage cell, said at least one breakable closure securing a unit dose of medication, said severable conductor being communicably connected to said electronic monitoring circuit;

(d) a conformal power supply, said conformal power supply comprising a plurality of layers printed on the medication package, said plurality of layers comprising at least one anode, at least one cathode, and at least one electrolytic layer interposed between said at least one anode and said at least one cathode;

(e) an RF transceiver affixed to said medication container, said RF transceiver being communicably connected to said at least one monitoring circuit; and (f) an RF antenna affixed to said medication container, said RF antenna being communicably connected to said RF transceiver;

wherein at least one severable conductor is severed upon breaking of the breakable closure, said severance being detected by said at least one monitoring circuit, wherein said RF transceiver transmits said detection associated with said severance, and wherein said detection is radiated from said RF antenna.

13. A package for medication according to claim 12, wherein said medication package has an open cell side and a closed cell side, said cells protruding from said closed cell side, and where said conformal power supply is printed on said closed cell side.

14. A package for medication according to claim 12, further comprising at least one environmental sensor, said at least one environment sensor affixed to said medication container, said at least one environment sensor being communicably connected to said electronic monitoring circuit, wherein data associated with said at least one environment sensor is acquired by said electronic monitoring circuit, wherein said RF transceiver further transmits said data associated with said at least one environment sensor, and wherein said data associated with said at least one environment sensor is radiated from said RF antenna.

15. A package for medication according to claim 14 wherein said at least one environment sensor comprises a temperature sensor.

16. A package for medication according to claim 15, wherein said temperature sensor is a thermistor.

17. A package for medication according to claim 15, wherein said temperature sensor is a thermocouple.

18. A package for medication according to claim 14, wherein said at least one environment sensor comprises a humidity sensor.

19. A package for medication according to claim 14, wherein said at least one environment sensor comprises a light sensor.

20. The package for medication according to claim 14, wherein said RF transceiver is integrated with said electronic monitoring circuit.

21. A package for medication according to claim 14 wherein said RF transceiver comprises at least one radio frequency identification device.

22. A package for medication according to claim 21, wherein said RF transceiver transmits in response to an RF signal received by said RF receiver.

23. A package for medication according to claim 14, wherein the data transmitted by said transceiver comprises a medication package identifier, a status of said severable conductors, and data associated with said at least one environmental sensor.

24. The package for medication according to claim 14, wherein said RF antenna comprises a printed circuit trace.

25. A package for medication, the package comprising:

(a) a medication container, the medication container having a plurality of storage cells, at least one storage cell being sealed by an associated breakable closure and holding a unit dose of a medication, said medication container comprising a first means for sensing temperature exposure;

(b) a severable conductor proximate to the breakable closure associated with said at least one storage cell sealed by a breakable closure, wherein said severable conductor is severed upon breaking of the associated breakable closure;

(c) an electronic monitoring circuit comprising means for monitoring
  (i) a first status indicating a severed condition of the associated breakable closure,
  (ii) a second status indicating temperature exposure of said medication container, (d) a means for transmitting said first status and said second status to a remote monitor.

26. A package for medication according to claim 25, wherein said medication container further comprises a light sensor, and wherein said electronic monitoring circuit further comprises means for monitoring a third status indicating light exposure of said medication container, and wherein said means for transmitting said first status and said second status to a remote monitor is further for transmitting said third status to a remote monitor.

27. The package for medication according to claim 26 wherein said means for monitoring a third status indicating light exposure of said medication container comprises a light detector, a threshold detector for comparison with light limits, and an elapsed time indicator whereby time duration of light exposure is monitored.

28. A package for medication according to claim 25, wherein said medication container further comprises a means for sensing humidity exposure, and wherein said electronic monitoring circuit further comprises means for monitoring a fourth status indicating humidity exposure of said medication container, and wherein said means for transmitting said first status and said second status to a remote monitor is further for transmitting said fourth status to a remote monitor.

29. The package for medication according to claim 28 wherein said means for monitoring a fourth status indicating humidity exposure of said medication container comprises a humidity sensor, a threshold detector for comparison with humidity limits, and an elapsed time indicator whereby time duration of humidity exposure is monitored.

30. The package for medication according to claim 25 wherein said electronic monitoring circuit further comprises one or more of a group consisting of a digital ASIC, an analog ASIC, a mixed mode ASIC, an FPGA, an LSI integrated circuit, and a VLSI integrated circuit.

31. The package for medication according to claim 25 wherein said means for monitoring a first status of the associated breakable closure comprises a digital multiplexer.

32. The package for medication according to claim 25 wherein said means for monitoring a second status indicating temperature exposure of said medication container comprises a threshold detector for comparison with temperature limits, and an elapsed time indicator whereby time duration of temperature exposure is monitored.

33. The package for medication according to claim 25 wherein said means for transmission of said first status and said second status comprises an RF transceiver and an RF antenna.

34. The package for medication according to claim 33, wherein said RF transceiver comprises one or more of the group consisting of an RFID, a digital ASIC, an analog ASIC, a mixed mode ASIC, an FPGA, a LSI integrated circuit, and a VLSI integrated circuit.

35. The package for medication according to claim 34 wherein said RF antenna comprises a printed circuit conductor trace.

36. The package for medication according to claim 25 wherein said electronic monitoring circuit, said severable conductors, and said means for transmission are mounted entirely on a single side of the package for medication.

37. The package for medication according to claim 25 wherein said electronic monitoring circuit, said severable conductors, and said means for transmission are mounted utilizing surface area of both sides of the package for medication wherein open cell side to closed cell side electrical connections are implemented as either plated-through holes or edge connections.

38. The method of monitoring the environment of a package for medication comprising the steps of:

providing a network of monitoring stations;

providing managed medication packaging for at least one medication, wherein the managed medication packaging includes severable conductors associated with individual medication cells, at least one environmental sensor, an RF transceiver, and monitoring circuitry for monitoring the severable conductors and the at least one environmental sensor;

providing said managed medication packaging for at least one medication with threshold information;

dispensing said managed medication packaging for at least one medication to a patient;

monitoring environmental exposures through the monitoring circuitry associated with the medication package;

monitoring through the monitoring circuit associated with the medication package the condition of severable conductors associated with the package;

transmitting from the medication package to a monitoring station data associated with the condition of the severable conductors and the environmental sensor.

39. The method of claim 38, further comprising the step of analyzing the data associated with the at least one environmental sensor to estimate the degradation of the efficacy of the at least one medication contained in the medication package, and determining based on the analysis whether the at least one medication has degraded to a point where the medication is unsuitable for use.

40. The method of claim 39, further comprising the step of informing a patient to whom the at least one medication has been prescribed that the at least one medication has expired when analysis of the data associated with the at least one environmental sensor yields a determination that the at least one medication has degraded to a point where the at least one medication is unsuitable for use.

41. The method of claim 39, further comprising the step of informing a physician responsible for the patient to whom the at least one medication package has been dispensed that the at least one medication has expired when analysis of the data associated with the at least one environmental sensor yields a determination that the at least one medication has degraded to a point where the at least one medication is unsuitable for use.

* * * * *